United States Patent
Afzali-Ardakani et al.

(10) Patent No.: US 7,253,431 B2
(45) Date of Patent: Aug. 7, 2007

(54) METHOD AND APPARATUS FOR SOLUTION PROCESSED DOPING OF CARBON NANOTUBE

(75) Inventors: Ali Afzali-Ardakani, Ossining, NY (US); Phaedon Avouris, Yorktown Heights, NY (US); Jia Chen, Ossining, NY (US); Christian Klinke, Ossining, NY (US); Paul M. Solomon, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 11/056,456

(22) Filed: Feb. 11, 2005

(65) Prior Publication Data
US 2006/0038179 A1 Feb. 23, 2006

Related U.S. Application Data

(60) Provisional application No. 60/549,185, filed on Mar. 2, 2004.

(51) Int. Cl.
*H01L 29/06* (2006.01)

(52) U.S. Cl. ............ 257/20; 257/22; 977/749; 977/938

(58) Field of Classification Search ........ 257/20, 257/22, 14; 977/742, 745, 749, 936, 938
See application file for complete search history.

(56) References Cited

U.S. PATENT DOCUMENTS

| | | |
|---|---|---|
| 6,891,227 B2 | 5/2005 | Appenzeller et al. |
| 2002/0130311 A1 | 9/2002 | Lieber et al. |
| 2005/0056826 A1 | 3/2005 | Appenzeller et al. |
| 2006/0038179 A1 | 2/2006 | Afzali-Ardakani et al. |

FOREIGN PATENT DOCUMENTS

| | | |
|---|---|---|
| JP | 2004-311733 | 4/2004 |
| JP | 2004517489 T | 6/2004 |
| WO | WO 02063693 | 8/2002 |

OTHER PUBLICATIONS

Appenzeller, J., et al., "Field-Modulated Carrier Transport in Carbon Nanotube Transistors", Physical Review Letters, vol. 89, No. 12, dated Sep. 16, 2002, pp. 126801-1 to 126801-4.

Chen, J., et al., "Self-aligned Carbon Nanotube Transistors with Charge Transfer Doping", Applied Physics Letters, published online Mar. 16, 2005, p. count 3.

Cui, X., et al., "Controlling Energy-Level Alignments at Carbon Nanotube/Au Contacts", Nano Letters, vol. 3, No. 6, published online Apr. 29, 2003, pp. 783-787.

(Continued)

*Primary Examiner*—Sara Crane
(74) *Attorney, Agent, or Firm*—Patterson & Sheridan, LLP; Kin-Wah Tong, Esq.; Ido Tuchman, Esq.

(57) ABSTRACT

A method is provided for doping a carbon nanotube. The method comprises exposing the nanotube to a one-electron oxidant in a solution phase. A method is also provided for forming a carbon nanotube FET device.

27 Claims, 10 Drawing Sheets

OTHER PUBLICATIONS

Derycke, R., et al., "Controlling Doping and Carrier Injection in Carbon Nanotube Transistors", Applied Physics Letters, vol. 80, No. 15, Dated Apr. 15, 2002, p. count 3.

Greytak, L., et al. "Growth and Transport Properties of Complementary Germanium Nanowire Field-effect Transistors", Applied Physics Letters, vol. 84, No. 21, dated May 24, 2004, pp. 4176-4178.

Javey, A., et al., "Carbon Nanotube Field-effect Transistors with Integrated Ohmic Contacts and High-$k$ Gate Dielectrics", Nano Letters, vol. 4, No. 3, Revised Manuscript Received Jan. 10, 2004, pp. 447-450.

Javey, A., "Advancements in Complementary Carbon Nanotube Field-effect Transistors", IEDM Conference 2003, pp. 1-4.

Kazaoui, S., et al. "Optical Absorption Spectroscopy of Single-wall Carbon Nanotubes Doped with a TCNQ Derivative", Elsevier Science B.V., Synthetic Metals, 2003, p. count 2.

Kong, J., et al., "Nanotube Molecular Wires as Chemical Sensors", Science Magazine, vol. 287, Dated Jan. 28, 2000, pp. 622-625.

Lee, J.U., et al., "Carbon Nanotube $p$-$n$ Junction Diodes", Applied Physics Letters, vol. 85, No. 1, dated Jul. 5, 2004, pp. 145-147.

Radosavljevic, S., et al., "Drain Voltage Scaling in Carbon Nanotube Transistors", Applied Physics Letters, vol. 83, No. 12, dated Sep. 22, 2003, pp. 2435-2437.

Radosavljevic, M., et al., "High Performance of Potassium $n$-doped Carbon Nanotube Field-effect Transistors", Applied Physics Letters, vol. 84, No. 18, dated May 3, 2004, pp. 3993-3695.

Martel, R., et al., "Single- and Multi-wall Carbon Nanotube Field-effect Transistors", Applied Physics Letters, vol. 73, No. 17, dated Oct. 26, 1998, pp. 2447-2449.

Shim, M., et al., "Polymer Functionalization for Air-stable n-Type Carbon Nanotube Field-effect Transistors", American Chemical Society, published on web Oct. 30, 2001, pp. 11512-11513.

Valentin, E., et al., "High-density Selective Placement Methods for Carbon Nanotubes", Elsevier Science B.V., Microelectronic Engineering, published 2002, pp. 491-496.

Wind, S.J., et al., "Vertical Scaling of Carbon Nanotube Field-effect Transistors Using Top Gate Electrodes", Applied Physics Letters, vol. 80, No. 20, dated May 20, 2002, pp. 3817-3819.

Appears to be Japanese Patent Publication for JP2005-055790; date of publication Mar. 3, 2005; copy consists of 3 pages.

Patent Abstract (English Translation) of JP2005-055790; filing date Jul. 8, 2003; copy consists of 1 unnumbered page.

METHOD AND APPARATUS FOR SOLUTION PROCESSED DOPING OF CARBON NANOTUBE

CROSS-REFERENCE TO RELATED APPLICATION

This application claims priority from Provisional Application Ser. No. 60/549,185 filed Mar. 2, 2004, which is herein incorporated by reference.

BACKGROUND

The present invention relates to nanostrutures and particularly to solution processing methods for doping a carbon nanotube (CN).

In the field of molecular nanoelectronics, few materials show as much promise as nanotubes, and in particular carbon nanotubes, which comprise hollow cylinders of graphite. Nanotubes are made into tiny electronic devices such as diodes and transistors, depending on the electrical characteristics of the nanotube. Nanotubes are unique for their size, shape, and physical properties. Structurally a carbon nanotube resembles a hexagonal lattice of carbon rolled into a cylinder.

Besides exhibiting intriguing quantum behaviors at low temperature, carbon nanotubes exhibit at least two important characteristics: a nanotube can be either metallic or semiconductor depending on its chirality (i.e., conformational geometry). Metallic nanotubes can carry extremely large current densities with constant resistivity. Semiconducting nanotubes can be electrically switched on and off as field-effect transistors (FETs). The two types may be covalently joined by sharing electrons. These characteristics make nanotubes excellent materials for making nanometer-sized semiconductor circuits.

Current methods for preparing nanotubes rely on the random formation of both metallic and semiconducting nanotubes. Under current methods, carbon nanotube FETs are fabricated from as-grown carbon nanotubes in ambient conditions. These nanotubes show p channel conduction due to oxygen interaction at the metal-carbon nanotube interface (V. Derycke et al. Appl. Phys. Lett. 80, 2773 (2002)). The oxygen content at the metal-carbon nanotube interface can be easily changed by standard fabrication processes (e.g., any post processing involving vacuum pumping such as thin film deposition). In fact, a p-carbon-nanotube FET can be easily converted to an ambipolar or n-carbon nanotube FET via vacuum pumping.

Current methods for p-doping of carbon nanotube using gaseous $NO_2$ require the device to be kept under a controlled environment to prevent dopant desorption. Current methods for n channel conduction of carbon nanotube FET require annealing/out-gassing oxygen at the contacts or by doping with electron-donating alkali metals (V. Derycke et al. Appl. Phys. Lett. 80, 2773 (2002)) or gases ($NH_3$). Both require a controlled environment and the devices degrade quickly and stop functioning upon exposure to air (J. Kong et al., Science, 287, 622 (2000)).

Carbon nanotube FETs are known to be Schottky barrier (SB) FETs, whose switching is dominated by the SBs formed at the metal/nanotube interface (J. Appenzeller et al., Phys. Rev. Lett. 89,126801 (2002)) and operate as p-type FETs in air (V. Derycke et al., Appl. Phys. Lett. 80, 2773 (2002)). As gate dielectric thickness scaled down, due to the quasi one dimensional-channel of the nanotube and the ultrathin carbon nanotube body thickness, the SB can be thinned sufficiently to allow thermally-assisted tunneling of electrons or holes, and carbon nanotube FETs operate as ambipolar FETs in air. The simultaneous injection of electrons and holes into carbon nanotube channel and the exponentially deteriorating OFF current (defined as the leakage current through transistor when the conduction is switched off) with an increasing drain field (M. Radosavljevic et al., Appl. Phys. Lett. 83, 2435 (2003)) is unacceptable in a scaled FET (where the OFF current can be as high as the ON current and the transistor cannot be switched off) for potential logic gates applications. In addition, the lack of control of current carbon nanotube FET fabrication methods has resulted in carbon nanotube FETs which exhibit a large variation in the device drive current, and a device threshold voltage being too high for ultimate device scaling.

There are no known methods for reliably preparing a carbon nanotube having particular characteristics. Nor are there known methods of nanotube separation such as selective synthesis (a procedure for the selective synthesis of a metallic or a semiconducting nanotube), or post-synthesis (a procedure for the isolation of metallic tubes from semiconducting tubes or to convert metallic tubes to semiconducting tubes). Particularly, there are no known methods for p-doping of carbon nanotube FETs. Therefore, there exists a need for a system and method which provide stable and consistent doping methods for the manufacture of carbon nanotube FETs wherein such nanotubes exhibit an improved drive current, a reduced/tunable threshold voltage and a suppression of minority carrier injection in off state (i.e., transformation from an ambipolar to a unipolar transistor) and are stable in ambient conditions.

SUMMARY OF THE INVENTION

In one embodiment, the present invention relates to nanostructures, and more particularly to a system and method for solution processed p-doping of carbon nanotube FETs. The present invention also relates to the formation of a carbon nanotube FET device. In one aspect of the invention, a method is provided for doping a carbon nanotube comprising the step of exposing the nanotube to a one-electron oxidant in a solution phase. In one embodiment, the concentration of the one-electron oxidant is from about 0.01 mM to about 20 mM and a temperature from about 10° C. to about 100° C. In one embodiment, the one-electron oxidant is selected from the group comprising of organic one electron oxidants, metal organic complexes pi-electron acceptors and silver salts. The organic one-electron oxidants are selected from the group consisting of trialkyloxonium hexachlroantimonate, antimony pentachloride, nitrosonium salts, tris-(pentafluorophenyl) borane and nitrosonium cation. The metal organic complexes comprise tris-(2,2'-bipyridyl) cobalt (III) and tris-(2,2'-bipyridyl) ruthenium (II), and the pi electron acceptors are selected from the group consisting of tetracyanoquinodimethane, benzoquinone, tetrachlorobenzoquinone, tetraflurobenzoquinone, tetracynaoethylene, tetrafluoro-tertracyanoquinodimethane, chloranil, bromanil and dichlorodicyanobenzoquinone.

In another aspect of the invention, a carbon nanotube FET device is provided. The device comprises a gate, a gate dielectric deposited on the gate, a channel comprising a p-doped region of a carbon nanotube on the gate dielectric, wherein the p-doped region is formed by solution processed doping with a one-electron oxidant, a source formed over a first end of the carbon nanotube, and a drain formed over a second end of the carbon nanotube. In another aspect, the device comprises a source formed over a first end of the gate dielectric, a drain formed over a second end of the gate dielectric, and a carbon nanotube is disposed over the gate dielectric and the source and the drain. In yet another aspect, the device comprises a second dielectric layer deposited on the carbon nanotube; and a top gate is formed on the second dielectric layer. In yet another aspect, the device comprises a source formed over a first doped end of a carbon nanotube, and a drain formed over a second doped end of the carbon nanotube.

In another aspect of the invention, a method of forming a carbon nanotube FET device is provided. The method comprises providing a gate, depositing a gate dielectric on the gate, forming a channel comprising a p-doped region of a carbon nanotube on the gate dielectric, wherein the p-doped region is formed by solution processed doping with a one-electron oxidant, forming a source over a first end of the carbon nanotube, and forming a drain over a second end of the carbon nanotube. In another aspect of the method, a source is formed over a first end of the gate dielectric, a drain is formed over a second end of the gate dielectric, and a carbon nanotube is disposed over the gate dielectric and the source and the drain. In yet another aspect of the method, a second dielectric layer is deposited on the carbon nanotube, and a top gate is formed on the second dielectric layer. In yet another aspect of the method, a channel is formed on the gate dielectric, a source is formed over a first doped end of the carbon nanotube, and a drain is formed over a second doped end of the carbon nanotube.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

Figure 1A:
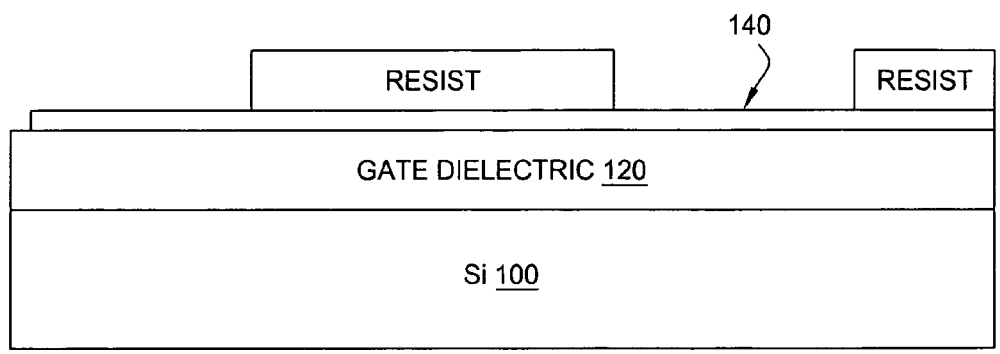
FIGS. 1A, 1B, 1C and 1D illustrate a schematic representation of the FET formation process.

In one embodiment, the present invention relates to a method for forming a carbon nanotube which has been doped by solution processing. The carbon nanotubes of the invention are air-stable and exhibit improved device performance in both on- and off-states. Characteristics of the carbon nanotube of the invention include without limitation, tunability of the threshold voltage Vth, an improved $I_{on}$ by about 1 to about 3 orders of magnitude, a suppressed minority carrier injection and immunity from drain induced $I_{off}$ degradation from regular SB carbon nanotube FET which in the case of carbon nanotube FET, transforms carbon nanotube FET from ambipolar to unipolar, a ratio of $I_{on}/I_{off}$ ratio of about $10^2$ to about $10^7$ and drain induced barrier lowering (DIBL) like behavior. $I_{on}$ is defined as the current when the transistor is switched on (Vg>Vth). One usually compares $I_{on}$ at a constant overdrive (i.e., Vg-Vth=constant, e.g., around 0.5V.

According to one embodiment of the present invention, a method is provided for the fabrication of a carbon nanotube FET device with carbon nanotube pinned down by a source and drain on top and at each end of a gate dielectric (for example silicon dioxide) and doped back gate (for example silicon). In one embodiment, a palladium source and drain electrodes can be used and are separated by about 10 nm to about 5 μm on top of about 2 nm to about 100 nm $SiO_2$ and Si backgate. The nanotube can be introduced in a solution comprising a one-electron oxidant which can oxidize aromatic compounds. P-doping may be accomplished by the reaction of the one-electron oxidant and aromatic compound on the carbon nanotube resulting in the formation of a charge transfer complex. The interaction of the carbon nanotube with the charge transfer complex results in the formation of a charged (radical cation) moiety on the carbon nanotube.

Solution processed doping with the one-electron oxidant is carried out in an organic solvent including without limitation, dichloromethane, acetonitrile, chloroform and mixtures thereof. Examples of one-electron oxidants useful in the solution processed doping of the invention include without limitation, organic one electron oxidants, metal organic complexes pi-electron acceptors and silver salts. Examples of organic one-electron oxidants include antimony compounds such as trialkyloxonium hexachlroantimonate, antimony pentachloride, nitrosonium salts (for example triethyl oxonium tetrafluoroborate), tris-(pentafluorophenyl) borane and nitrosonium cation. Examples of metal organic complexes include tris-(2,2'-bipyridyl) cobalt (III) and tris-(2,2'-bipyridyl) ruthenium (II). Examples of pi electron acceptors include tetracyanoquinodimethane, benzoquinone, tetrachlorobenzoquinone, tetraflurobenzoquinone, tetracynaoethylene, tetrafluoro-tertracyanoquinodimethane, chloranil, tromanil and dichlorodicyanobenzoquinone. Examples of silver salts include silver fluoride, and silver trifluoroacetate. For organometallic dopants, common organic solvents like acetonitrile, tetrahydrofuran and aromatic hydrocarbons and chlorinated solvents like dichloromethane and chloroform are suitable. For inorganic salts like silver fluoride either alcohols or mixture of alcohols and water can be employed.

In one embodiment, triethyloxonium hexachloroantimonate $(C_2H_5)_3O^+SbCl_6^-$ can be used, e.g., with concentration range of about 1-10 mM, and temperature range of about 10-100° C., and one exemplary solvent is acetonitrile. It is believed that the antimonite reacts as follows with the carbon nanotube. If 1 represents the benzene ring(s) on a carbon nanotube, then

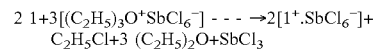

According to one method, doping of the nanotube can be carried out on a device with nanotube as channel material.

According to another method, doping of the nanotube can also be carried out in bulk. By either methods, the p-doped carbon nanotube shows an improvment of drive current by about 1 to about 2 order of magnitude, an increase of threshold voltage by about 0.5 to about 1 volt, a suppression of electron current in ambipolar transistors, a transformation of a scaled carbon nanotube FET from ambipolar to unipolar, a ratio of $I_{on}/I_{off}$ ratio of about $10^2$ to about $10^7$ and exhibiting excellent DIBL. The doped nanotubes are stable in ambient conditions.

Device doping is generally conducted by exposing the device incorporating a single nanotube to the dopant such as the one-electron oxidant in solution with an organic solvent. The concentration of the one-electron oxidant in the organic solution is from about 0.01 mM to about 20 mM, and the temperature is from about 10° C. to about 100° C. The rate of the reaction and temperature are controlled to achieve a charge density of from about 0.01 to about 1 electron/ nanometer of length of tube. Any excess one-electron oxidant on the nanotube is removed by rinsing the nanotube in the same or different organic solvent used in the doping process. Following rinsing, the device is dried under vacuum.

In one method of the invention, bulk doping is achieved by stirring a suspension of the nanotube in the organic solvent in the presence of the one-electron oxidant in solution in the organic solvent. The concentration of the one-electron oxidant in the organic solution is from about 0.01 mM to about 20 mM, and the temperature is from about 10° C. to about 100° C. The rate of the reaction and the temperature are controlled to achieve a charge density of from about 0.01 to about 1 electron/nanometer of length of tube. Any excess one-electron oxidant on the nanotube is removed by rinsing the nanotube in the same or different organic solvent used in the doping process. Following rinsing, the sample, e.g., the bulk nanotube is dried under vacuum.

FIGS. 1A-1D illustrate a method of forming a FET according to one embodiment of this invention. A gate dielectric 120 such as silicon dioxide, or oxynitride, or high K material layer is deposited on gate 100, which is generally a doped silicon substrate. In one embodiment, the silicon substrate is degenerately doped. The gate dielectric has a thickness from about 1 to about 100 nm. A nano-component 140, e.g., carbon nanotube, is deposited on gate dielectric 120 by spin-coating a solution containing the nanotubes. The deposition of carbon nanotubes by spin coating from a liquid suspension is known in the art; and solvents may include, e.g., dichloroethane, N-methylpyrolidone, N,N-dimethylformamide and water. A resist pattern is then formed on the carbon nanotube 140 by conventional lithographic techniques. For example, a resist layer can be deposited over the carbon nanotube 140 and patterned by using e-beam lithography or photolithography. With a positive resist, regions of the resist layer exposed to the e-beam or lithographic radiation are removed by using a developer, resulting in a structure with resist pattern shown in FIG. 1A. The resist pattern formed on the carbon nanotube may have one or multiple separations from about 10 nm to about 500 nm when e-beam lithography is used, and from about 500 nm to about 10 µm with photolithography. The multiple separations correspond to the line and space separations resulting from the respective lithographic techniques, and represent separations between adjacent top gates. The availability of multiple top gates provides flexibility of individual control for different logic applications, e.g., AND, OR, NOR operations.

Figure 1B:
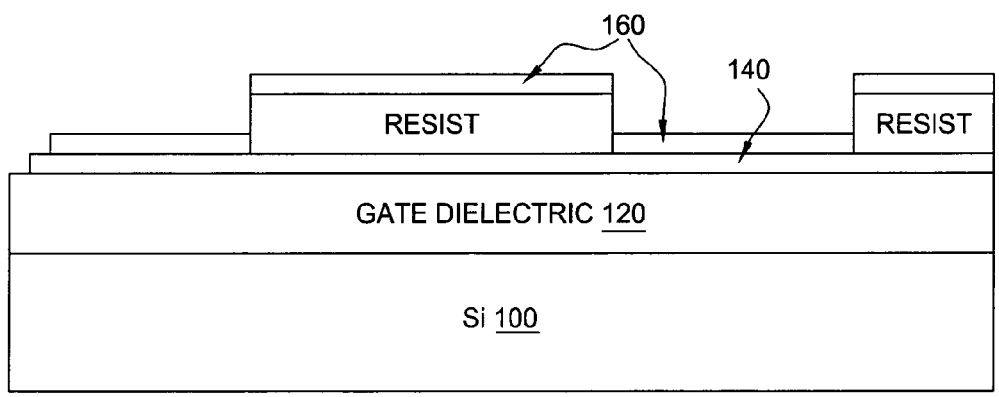

As shown in FIG. 1B, a metal 160, having a thickness ranging from about 15 nm to about 50 nm, is deposited on the resist pattern and over portions of the carbon nanotube 140. The metal can be Pd, Ti, W, Au, Co, Pt, or alloys thereof, or a metallic nanotube. If a metallic nanotube is used, the metal 160 may include one or more metallic nanotubes. Other metals or alloys of Pd, Ti, W, Au, Co, Pt, can be deposited by e-beam or thermal evaporation under vacuum, while metallic nanotubes can be deposited with solution phase techniques such as spin coating. Following deposition of the metal, the structure can be immersed in acetone or N-methylpyrrolidone (NMP) for resist liftoff, a process that removes the lithographically patterned resist and the metal deposited on top by soaking the sample in solvents such as acetone or NMP. For the purpose of this disclosure, such solvents are also referred generally as resist liftoff components. The metal portions 162 and 164 (shown in FIG. 1C) remaining on the carbon nanotube 140 form the FET source and drain. In this embodiment, the source and drains are formed over a first and a second region, respectively, of the carbon nanotube 140, and more generally, of the nano-component 140.

Figure 1C:
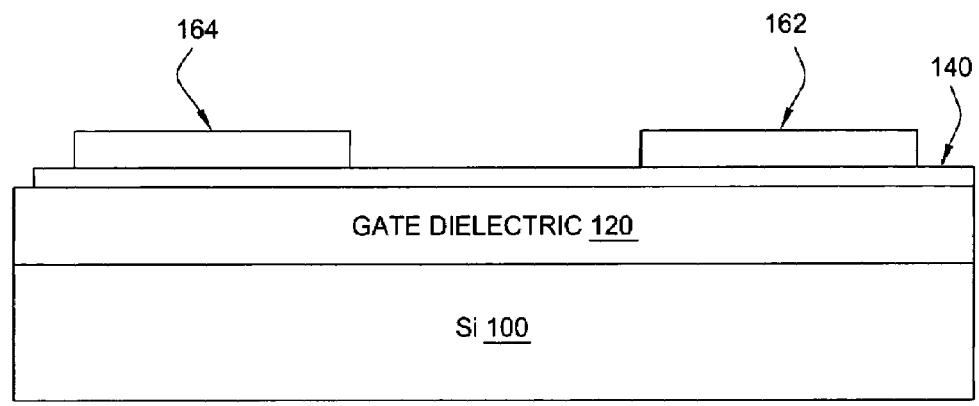
Figure 1D:
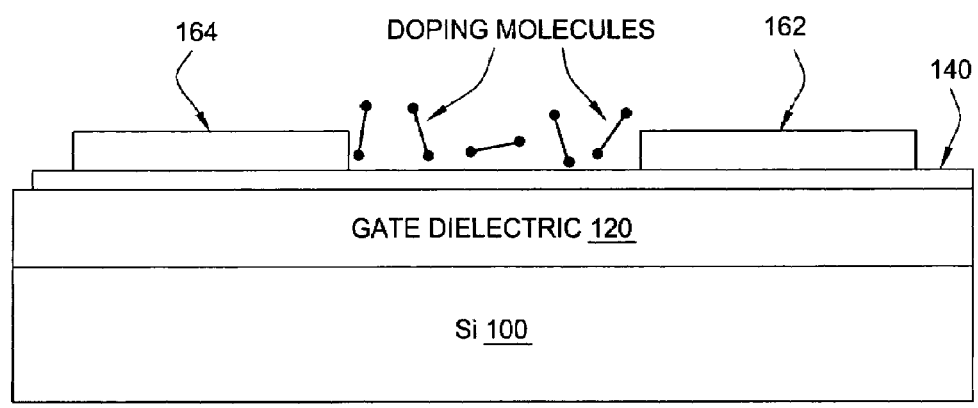

Following resist liftoff, the structure in FIG. 1C with the carbon nanotube 140 is immersed in an organic solution comprising a suitable one-electron oxidant dopant, as discussed above. FIG. 1D illustrates the doping molecules bonding to the carbon nanotube 140. The doped portion of the carbon nanotube 140 (between the metal source and drain) acts as the channel of the FET.

Figure 2:
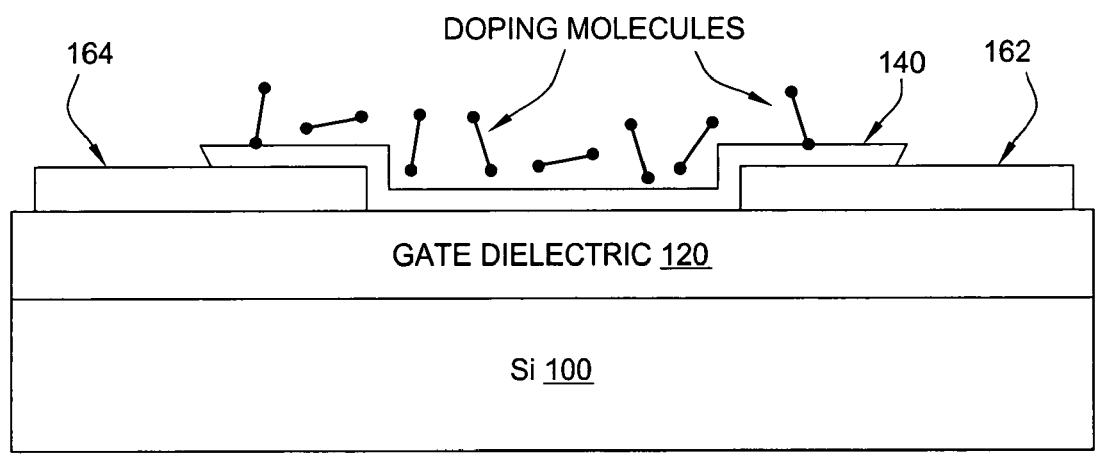
FIG. 2 illustrates a schematic view of another embodiment of a carbon nanotube FET.

FIG. 2 illustrates another embodiment of a carbon nanotube FET. On gate 100 which, in this embodiment, is a degenerately doped silicon substrate, a gate dielectric 120 such as silicon dioxide, or oxynitride stack, or high K material layer of from about 1 to about 100 nm thick is deposited. Metal portions 162 and 164 are then formed on gate dielectric 120 using a resist liftoff process (not shown) similar to that previously described for FIGS. 1A-1C. The metal portions 162 and 164, having a thickness of from about 15 nm to about 300 nm, form the FET source and drain. The metal can be Pd, Ti, W, Au, Co and Pt, or alloys thereof, or one or more metallic nanotubes. A carbon nanotube 140 is then disposed over the gate dielectric 120 and the metal portions 162, 164. Blanket doping of the carbon nanotube 140 is achieved by immersing in an organic solution comprising a suitable one-electron oxidant dopant. The doping molecules bond to the carbon nanotube as described herein. In this illustration, the portion of the carbon nanotube 140 in contact with the gate dielectric 120 forms the channel of the FET. Alternatively, the carbon nanotube 140 can be selectively doped through a patterned resist that is formed over the carbon nanotube 140. The patterned resist may be formed, for example, by depositing a suitable resist material over the carbon nanotube 140 and patterning using conventional lithographic techniques. In one embodiment, hydrogen silsesquioxane (HSQ), a dielectric that can be used as a negative resist, may be used for this purpose.

Figure 3:
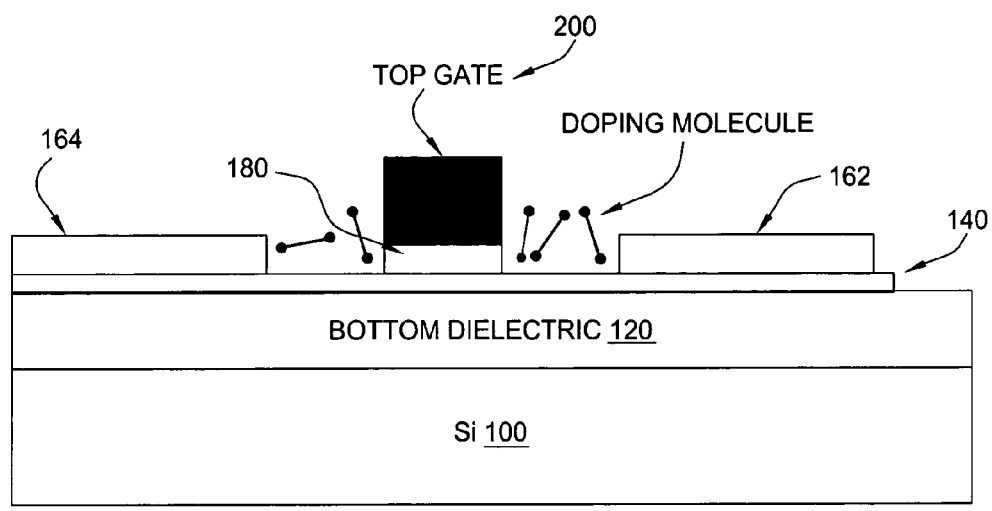
FIG. 3 illustrates a schematic view of a dual-gate carbon nanotube FET.

FIG. 3 illustrates a dual gate carbon nanotube FET with a top gate. On gate 100 which, in this embodiment, is a degenerately doped silicon substrate, a gate dielectric 120 such as silicon dioxide or oxynitride stack or high K material layer of from about 1 to about 100 nm thick is deposited. On gate dielectric 120, a carbon nanotube 140 is deposited, e.g., by spin-coating. Metal portions 162, 164 are formed over the carbon nanotube 140 using a resist liftoff technique such as that described in connection with FIGS. 1A-1C. Following formation of the metal portions 162, 164 (acting as source and drain of the FET), the structure containing the carbon nanotube 140 and metal portions 162, 164 is covered with a dielectric layer 180 which can be a low temperature oxide (LTO) or a CVD high-K dielectric (e.g., hafnium dioxide) layer. A top gate 200, which can comprise a metal or highly doped polysilicon, is formed and patterned on top of dielectric layer 180. With the top gate 200 acting as an etch mask, the dielectric layer 180 is etched such that only the portion underneath the top gate 200 remains. As an example, a dilute hydrofluoric acid (e.g., 100:1 HF) can be used as an etchant for the LTO. The device is doped in a dopant solution to achieve partial doping of the carbon nanotube 140. The doping molecules bond to the carbon nanotube as described herein. In this case, the channel consists of both the gated undoped region and the 2 doped regions. The doped regions acts like the "extension" of a CMOS FET, where it reduces contact barrier and improves drive current and transistor switching. The device can be operated by either the top (or front) gate or the back gate or both. In logic applications, it is desirable to operate a FET with the top gate configuration for good AC performance.

Figure 4A:
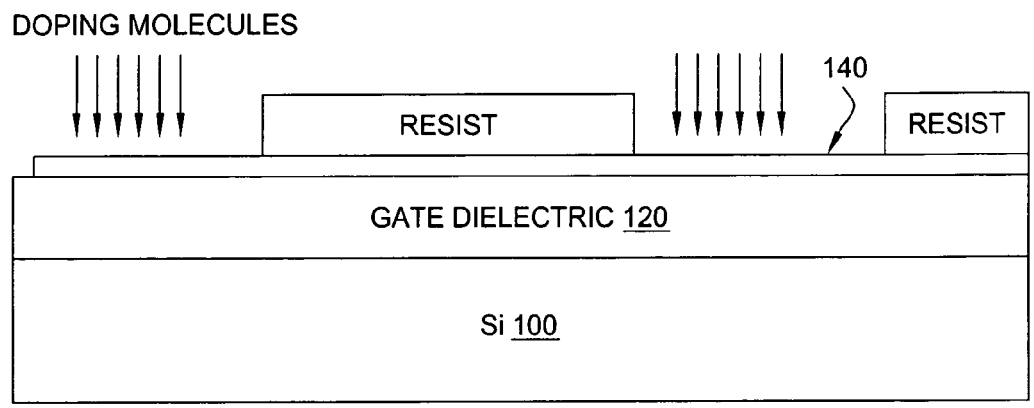
FIGS. 4A-4C illustrate another embodiment of a FET.
Figure 4B:
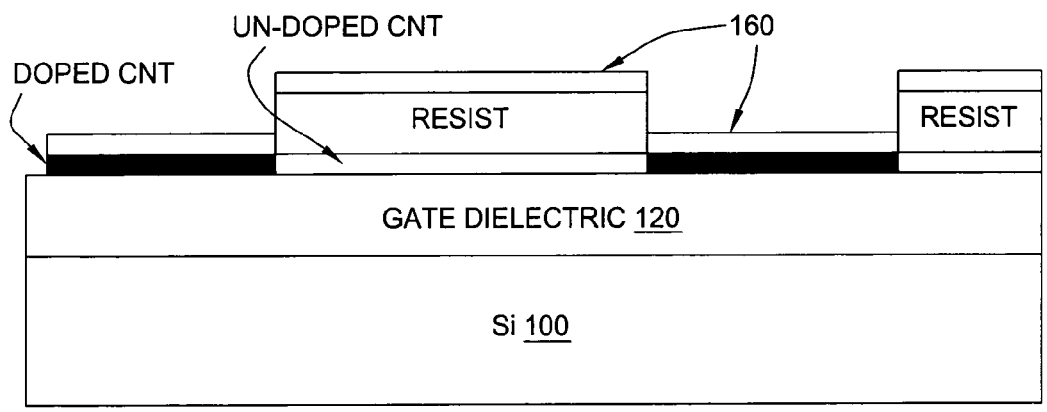
Figure 4C:
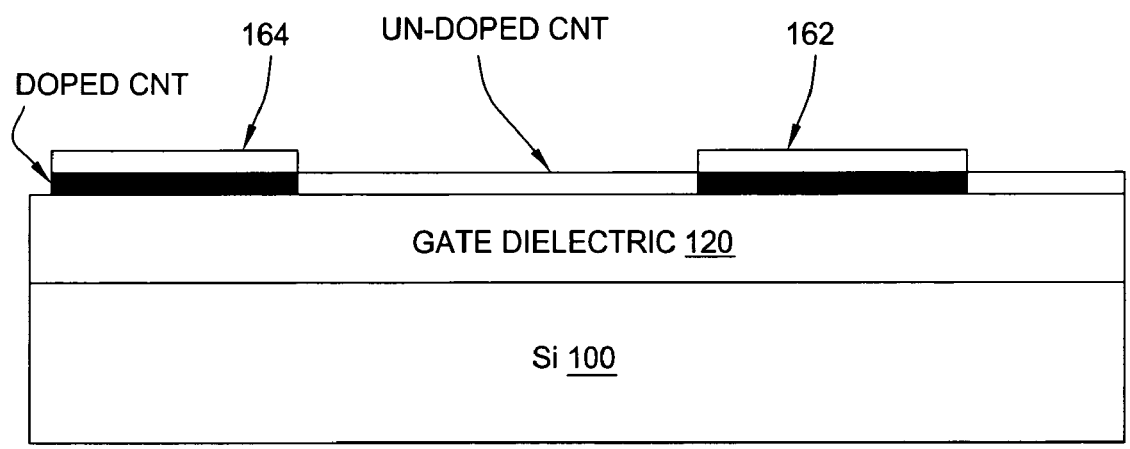

FIGS. 4A-4C illustrate another embodiment of a FET. On gate 100 which, in one embodiment, is a degenerately doped silicon substrate, a gate dielectric 120 such as silicon dioxide or high K material layer of from about 1 to about 100 nm thick is deposited. On gate dielectric 120, a carbon nanotube 140 is deposited, e.g., by spin-coating a solution containing the nanotubes onto the device structure. A patterned resist is formed on the carbon nanotube 140 using conventional lithographic techniques such as e-beam or photolithography. The structure containing the patterned resist and carbon nanotube 140 is immersed in an organic solution comprising a suitable one-electron oxidant dopant. The doping molecules bond to the exposed portions of the carbon nanotube 140. Following doping, a metal layer 160 having a thickness of from about 15 nm to about 50 nm is deposited over the patterned resist and the doped carbon nanotube 140. The metal can be Pd, Ti, W, Au, Co and Pt, or alloys thereof, or one or more metallic nanotubes and can be deposited as discussed above, e.g., using e-beam or thermal evaporation, spin coating and the like. Following deposition of the metal, the structure shown in FIG. 4B is immersed in acetone or NMP for resist liftoff, a process that removes the lithographically pattern resist and the metal deposited on top by soaking the sample in solvents such as acetone or NMP. As shown in FIG. 4C, the metal portions 162, 164 remaining after liftoff form the source and drain of the FET. The process of FIGS. 4A-4C generates a significant doping profile difference along the channel of the carbon nanotube transistor. Note that in this case, the undoped portion of the carbon nanotube 140 forms the channel of the FET.

To complete the formation of the FET device of FIGS. 1A, 1B, 1C and 1D, the device is passivated by covering with a spin-on organic material like PMMA (poly(methyl methacrylate)) or HSQ (hydrogensilsesquioxanes, a low K dielectric layer) or by depositing a low temperature dielectric film-like silicon dioxide. Further processing of the device is accomplished via metallization for the back-end of the line.

Figure 5:
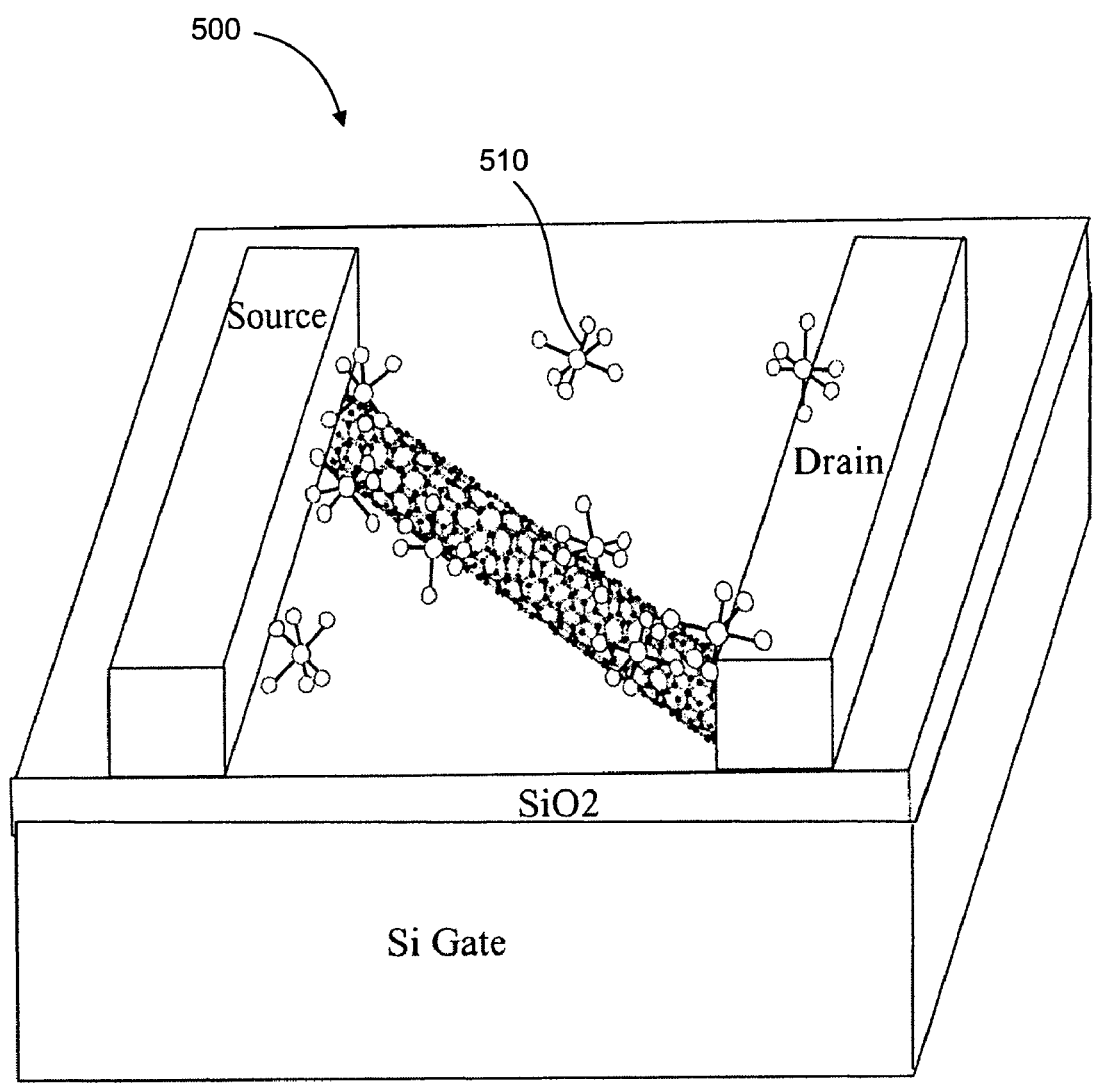
FIG. 5 illustrates a schematic view of a doped carbon nanotube FET with $SbCl_6^-$ counterion.

Referring to FIG. 5, a schematic view is shown of a doped carbon nanotube FET 500 with $SbCl_6^-$ counterion 510. For example, the dopant can be $(C_2H_5)_3O^+SbCl_6^-$, thereby resulting in the $SbCl_6^-$ counterion being electrostatically "attached" to the carbon nanotube, and $C_2H_5Cl$, $(C_2H_5)_2O$ and $SbCl_3$ as being given off as volatile products (not shown).

Figure 6:
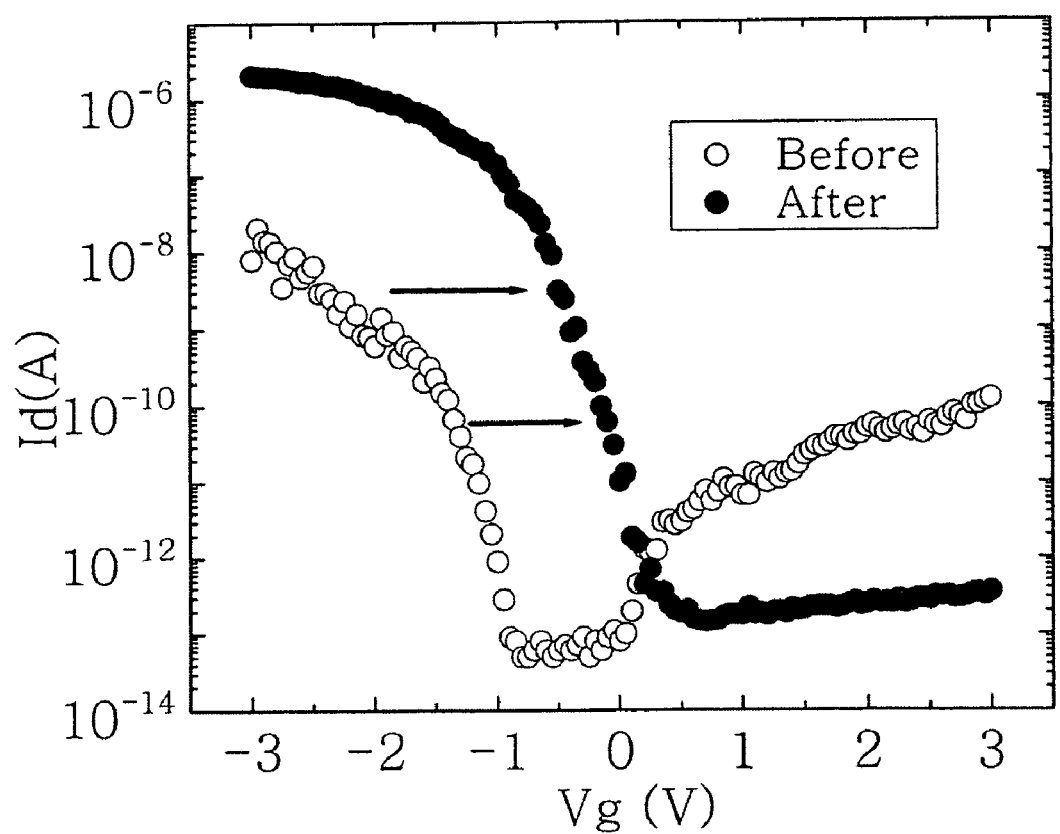
FIG. 6 illustrates transfer characteristics (Id vs. Vgs) at Vds=-0.5V of a carbon nanotube FET before and after doping by $(C_2H_5)_3O^+SbCl_6^-$.

Referring to FIG. 6, typical transfer characteristics (Id vs. Vgs) at Vds=−0.5V of a carbon nanotube FET before and after doping by $(C_2H_5)_3O^+SbCl_6^-$ are shown. In this example, doping was done by exposing the device containing the carbon nanotube to a solution containing $(C_2H_5)_3O^+SbCl_6^-$ dissolved in acetonitrile (e.g., a solvent) at a concentration of about 1-10 mM and a temperature of about 50° C. for about 12 hours. It is understood that, depending on the specific dopant and device characteristics desired, other process conditions may also be used, e.g., concentration ranging from about 0.01 mM to about 20 mM, and temperature from about 10 to about 100° C. The Vth for hole conduction increased from −1.55V (intrinsic carbon nanotube FET) to −0.85V, which is indicative of electron transfer from the nanotube to the dopant $(C_2H_5)_3O^+SbCl_6^-$, moving the nanotube Fermi level EF toward valence band, and Vth tuned to a technologically relevant gate bias range. The drive current $I_{on}$ improved by 2 orders of magnitude, greatly reducing contact resistance between tube and metal. After doping, the minority carrier (electron current) injection was suppressed at the drain and the carbon nanotube FET was transformed from ambipolar to unipolar. Ambipolar is understood to mean that both carriers (electrons and holes) participate in channel conduction, and unipolar is understood to mean that only one type of carriers participates in channel conduction (holes for p-type and electrons for n-type).

Figure 7:
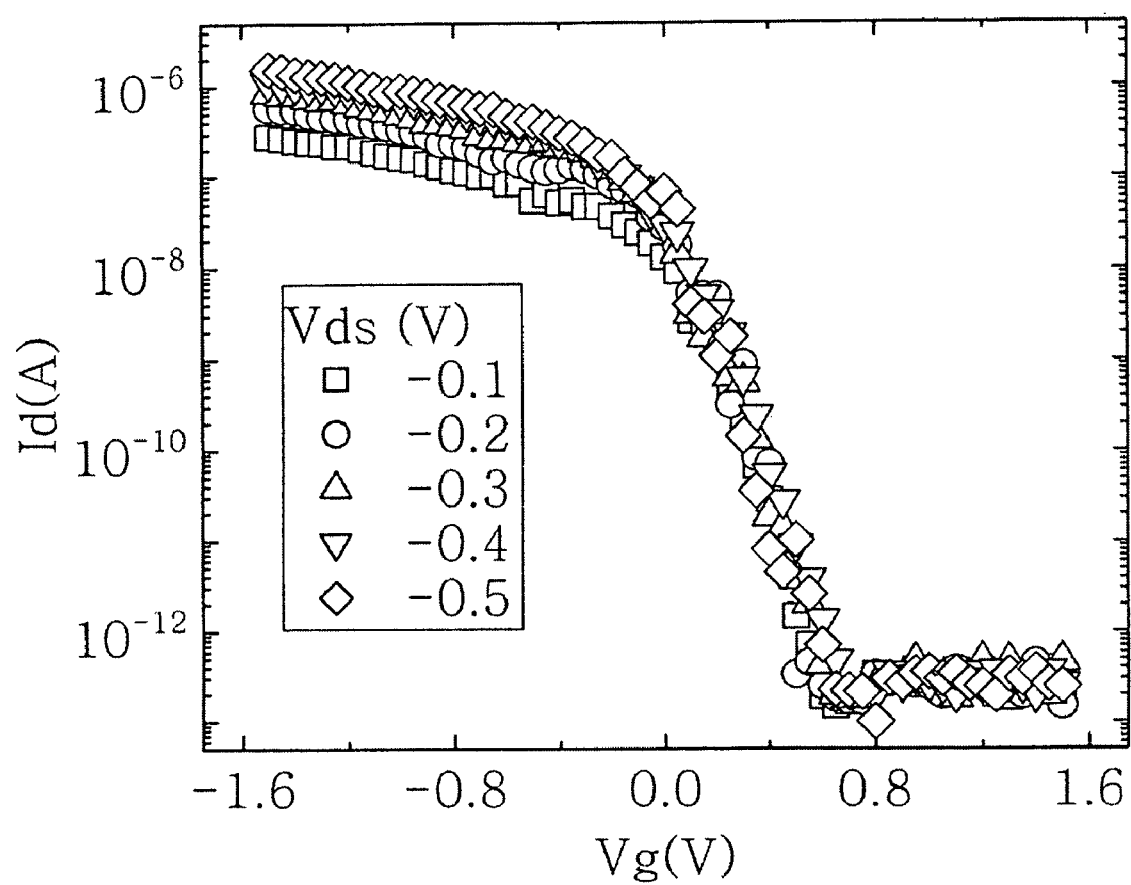
FIG. 7 illustrates the Id-Vgs characteristics for a device after doping by $(C_2H_5)_3O^+SbCl_6^-$ at various Vds (-0.1 to -0.5 at -0.1V step)

In FIG. 7, the Id-Vgs characteristics for the above doped device at various Vds (−0.1 to −0.5 at −0.1V step) are shown. The complete suppression of drain field induces minority carrier injection and drain-induced barrier lowering (DIBL)-like behavior. This alludes to a potentially stronger affinity/absorption of the dopants to the metal contact/tube interface, generating a non-uniform doping profile along the length of the tube. This may be attributed to the fact that there may be more dopants aggregating at the nanotube/metal interface causing strong band bending to suppress minority carrier (electron) injection at the off state. A decreased subthreshold swing S=dVgs/d(logId) from 120 to 85 mV/decade (post doping Id-Vg) shows improved switching and excellent gate control of the carbon nanotube channel.

Figure 8:
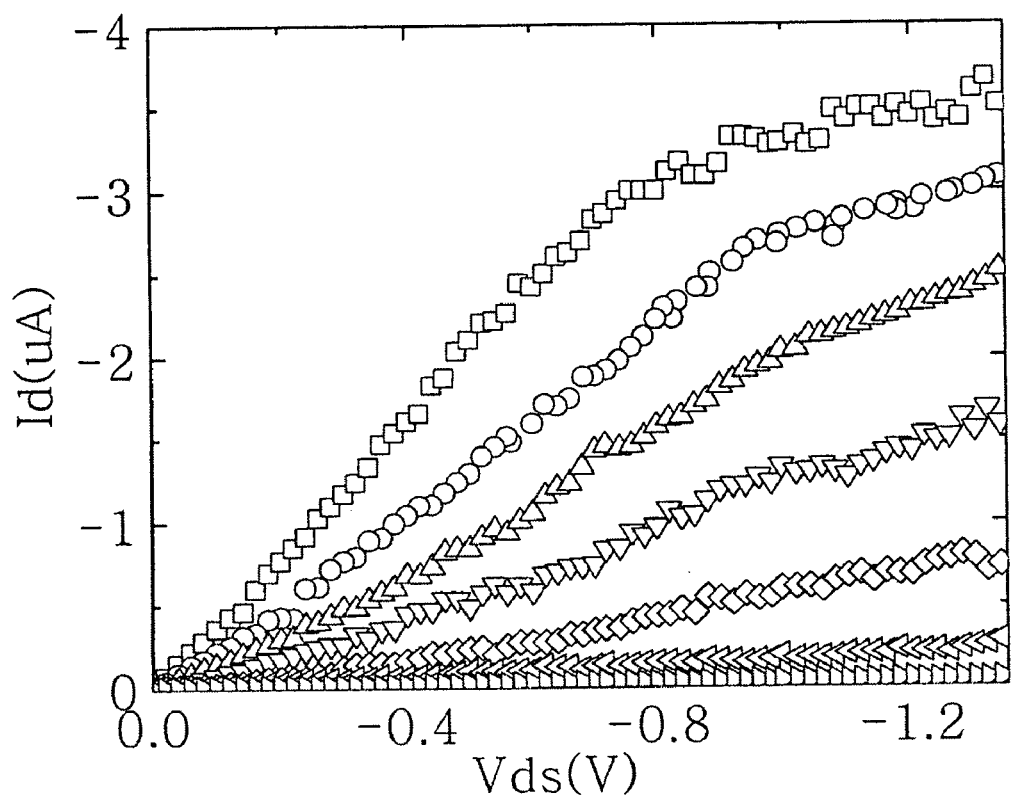
FIG. 8 illustrates the output characteristics (Id vs. Vds) of a p-doped device.

FIG. 8 shows the output characteristics (Id vs. Vds) of a p-doped device as discussed above. Its transconductance $g_m$ ($dI_d/dV_g$) at Vds=−1.32V is 2 uS, outperforming p-CNFET with small diameter carbon nanototubes with a gate dielectric being used. The devices are stable in air for weeks and preserve their doping characteristics after solvent washing and vacuum pumping. Furthermore, the absorption of the dopant on the device of the invention is irreversible.

It should be noted that the structures as illustrated in the Figures of the present invention are not drawn to scale. Namely, the various structures are illustrated as exemplary examples. As such, the length, height and width of various structures as shown in the Figures should not be interpreted as a limitation in the present invention.

Having described the foregoing embodiments, it is to be noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

We claim:

1. A method for doping a carbon nanotube comprising:
exposing the carbon nanotube to a one-electron oxidant in a solution, such that one electron is transferred from the carbon nanotube to each molecule of the one-electron oxidant.

2. The method of claim 1 wherein the concentration of the one-electron oxidant is from about 0.01 mM to about 20 mM.

3. The method of claim 2, wherein the one-electron oxidant is selected from at least one of: organic one electron oxidant, metal organic complex, pi-electron acceptor and silver salt.

4. The method of claim 3 wherein the organic one-electron oxidant is selected from at least one of: trialkyloxonium hexachlroantimonate, antimony pentachloride, nitrosonium salt, triethyl oxonium tetrafluoroborate, tris-(pentafluorophenyl) borane and nitrosonium cation.

5. The method of claim 3, wherein the metal organic complex comprises at least one of tris-(2,2'-bipyridyl) cobalt (III) and tris-(2,2'-bipyridyl) ruthenium (II).

6. The method of claim 3, wherein the pi electron acceptor is selected from at least one of: tetracyanoquinodimethane, benzoquinone, tetrachlorobenzoquinone, tetraflurobenzoquinone, tetracynacethylene, tetrafluoro-tertracyanoquinodimethane, chloranil, bromanil and dichlorodicyanobenzoquinone.

7. The method of claim 3, wherein the silver salt is silver fluoride.

8. A carbon nanotube field-effect transistor (FET) device comprising:
a gate;
a gate dielectric deposited on the gate;
a carbon nanotube deposited on the gate dielectric, wherein said carbon nanotube has at least one doped region that is formed by solution processed doping with a one-electron oxidant, such that one electron is transferred from the carbon nanotube to each molecule of the one-electron oxidant;
a source formed over a first end of the carbon nanotube; and
a drain formed over a second end of the carbon nanotube.

9. The carbon nanotube FET device of claim 8, wherein said at least one doped region is a p-doped region.

10. The carbon nanotube FET device of claim 8, wherein said at least one doped region serves as a channel for the FET.

11. The carbon nanotube FET device of claim 8, further comprising:
a dielectric layer deposited on said carbon nanotube; and
a top gate deposited on the dielectric layer.

12. The carbon nanotube FET device of claim 11, wherein said at least one doped region of the carbon nanotube comprises doped regions that are not in contact with the dielectric layer, the source or the drain.

13. The carbon nanotube FET device of claim 8, wherein said at least one doped region comprises two doped regions, where the source is deposited on one of said doped regions and the drain is deposited on the other one of said doped regions.

14. A carbon nanotube field-effect transistor (FET) device comprising:
a gate;
a gate dielectric deposited on the gate;
a source formed over a first end of the gate dielectric;
a drain formed over a second end of the gate dielectric; and
a carbon nanotube deposited on the source, the drain and the gate dielectric, wherein said entire carbon nanotube is doped by solution processed doping with a one-electron oxidant, such that one electron is transferred from the carbon nanotube to each molecule of the one-electron oxidant.

15. The carbon nanotube FET device of claim 14, wherein said doped carbon nanotube is p-doped.

16. The carbon nanotube FET device of claim 14, wherein a portion of said doped carbon nanotube that is in contact with the gate dielectric serves as a channel for the FET.

17. A method of forming a carbon nanotube field-effect transistor (FET) device comprising:
providing a gate;
depositing a gate dielectric on the gate;
forming a carbon nanotube on the gate dielectric, wherein said carbon nanotube has at least one doped region that is formed by solution processed doping with a one-electron oxidant, such that one electron is transferred from the carbon nanotube to each molecule of the one-electron oxidant;
forming a source over a first end of the carbon nanotube; and
forming a drain over a second end of the carbon nanotube.

18. The method of claim 17, wherein said at least one doped region is a p-doped region.

19. The method of claim 17, wherein said forming said source and forming said drain comprises the steps of:
applying a resist layer over said carbon nanotube;
depositing a metal layer over said resist layer; and
applying a resist liftoff component to said metal layer to form said drain and said source.

20. The method of claim 17, further comprising:
depositing a dielectric layer on said carbon nanotube; and
depositing a top gate on the dielectric layer.

21. The method of claim 20, wherein said at least one doped region of the carbon nanotube comprises regions that are not in contact with the dielectric layer, the source or the drain.

22. The method of claim 20, wherein said forming said source and forming said drain comprises the steps of:
applying a resist layer over said carbon nanotube;
depositing a metal layer over said resist layer; and
applying a resist liftoff component to said metal layer to form said drain and said source.

23. The method of claim 17, wherein said at least one doped region comprises two doped regions, where the source is deposited on one of said doped regions and the drain is deposited on the other one of said doped regions.

24. The method of claim 23, wherein said forming said source and forming said drain comprises the steps of:
applying a resist layer over said carbon nanotube;
applying said solution of one-electron oxidant to said carbon nanotube;
depositing a metal layer over said resist layer; and
applying a resist liftoff component to said metal layer to form said drain and said source.

25. A method of forming a carbon nanotube field-effect transistor (FET) device comprising:
providing a gate;
depositing a gate dielectric on the gate;
forming a source over a first end of the gate dielectric;
forming a drain a second end of the gate dielectric; and
forming a carbon nanotube deposited on the source, the drain and the gate dielectric, wherein said entire carbon nanotube is doped by solution processed doping with a one-electron oxidant, such that one electron is transferred from the carbon nanotube to each molecule of the one-electron oxidant.

26. The method of claim 25, wherein said doped carbon nanotube is p-doped.

27. The method of claim 25, wherein said forming said source and forming said drain comprises the steps of:

applying a resist layer over said gate dielectric;

depositing a metal layer over said resist layer; and applying a resist liftoff component to said metal layer to form said drain and said source.

\* \* \* \* \*